US007428308B2

(12) United States Patent
Jones et al.

(10) Patent No.: US 7,428,308 B2
(45) Date of Patent: Sep. 23, 2008

(54) TRANSMITTING AND REPRODUCING STEREOPHONIC AUDIO SIGNALS

(75) Inventors: Marcus Richard Jones, Lincoln (GB); Terence Christopher Aliwell, Welton (GB)

(73) Assignee: Zarlink Semiconductor Limited, Wiltshire (GB)

( * ) Notice: Subject to any disclaimer, the term of this patent is extended or adjusted under 35 U.S.C. 154(b) by 857 days.

(21) Appl. No.: 10/340,202

(22) Filed: Jan. 10, 2003

(65) Prior Publication Data

US 2003/0142839 A1 Jul. 31, 2003

(30) Foreign Application Priority Data

Jan. 10, 2002 (GB) ................................ 0200499.2

(51) Int. Cl.

| | |
|---|---|
| ***H04H 20/47*** | (2008.01) |
| ***H04H 20/48*** | (2008.01) |
| ***H04H 40/72*** | (2008.01) |
| ***H04R 5/00*** | (2006.01) |
| ***H03G 5/00*** | (2006.01) |
| ***H04B 1/04*** | (2006.01) |
| ***H04B 1/26*** | (2006.01) |
| ***G06F 17/00*** | (2006.01) |

(52) U.S. Cl. ..................... 381/2; 381/3; 381/1; 381/98; 381/103; 381/17; 381/6; 381/14; 381/18; 381/22; 381/23; 700/94; 455/118; 455/313; 455/323

(58) Field of Classification Search ............... 381/2–23, 381/98, 103, 1, 77, 80; 455/42, 118, 209, 455/313–320, 323; 700/94
See application file for complete search history.

(56) References Cited

U.S. PATENT DOCUMENTS

| | | | | |
|---|---|---|---|---|
| 3,732,375 | A * | 5/1973 | Kuribayashi | 370/206 |
| 5,319,713 | A * | 6/1994 | Waller et al. | 381/22 |
| 5,325,435 | A * | 6/1994 | Date et al. | 381/1 |
| 5,960,037 | A * | 9/1999 | Ten Kate | 375/240 |

FOREIGN PATENT DOCUMENTS

| | | | |
|---|---|---|---|
| DE | 3418297 | A | 11/1985 |
| EP | 1215848 | A1 | 6/2002 |
| FR | 2373937 | A | 7/1978 |
| GB | 0200499.2 | | 2/2002 |
| WO | WO 02/05593 | A2 | 1/2002 |

* cited by examiner

*Primary Examiner*—Vivian Chin
*Assistant Examiner*—Devona E. Faulk
(74) *Attorney, Agent, or Firm*—Dority & Manning, P.A.

(57) ABSTRACT

Apparatus and method for transmitting and reproducing stereophonic audio signals are disclosed. The method comprises splitting first and second channels into two frequency bands, combining the lower frequency band signals of the two channels, and transmitting the combined signals of the two channels or signals representative thereof. The apparatus comprises: a splitter for splitting each of the two channels into two frequency bands, a combiner, for combining the lower frequency band signals of the two channels, and a transmitter for transmitting the combined signals, or signals representative thereof, and the higher frequency band signals of the two channels, or signals representative thereof.

21 Claims, 3 Drawing Sheets

TRANSMITTING AND REPRODUCING STEREOPHONIC AUDIO SIGNALS

CROSS-REFERENCE TO RELATED APPLICATIONS

The present application claims priority to currently pending United Kingdom Patent Application number 0200499.2, filed on Jan. 10, 2002.

STATEMENT REGARDING FEDERALLY SPONSORED RESEARCH OR DEVELOPMENT

N/A

BACKGROUND OF THE INVENTION

This invention relates to methods of and apparatus for transmitting stereophonic audio signals. This invention relates also to apparatus for reproducing stereophonic signals.

The Bluetooth standard allows for devices to communicate with each other in a wireless fusion with certain defined channels, including three 64 kb per second SCO channels. Each channel can carry sampled audio signals having a bandwidth of a 4 kHz with 8 bit samples. However, 4 kHz is regarded as not being suitable for use with portable hi-fi equipment, although it is regarded as being sufficient for carrying voice signals.

It is known to reduce the amount of digital data required to represent stereophonic sound signals using coders according to the MPEG-1 standard. Stereophonic signals reconstructed after MPEG-1 compression tend to be of a very high quality. However, MPEG coders and decoders are not cheap to produce, and they tend to have quite high power consumption. As a result, it is desirable to avoid their use in portable, battery-operated equipment.

OBJECTS AND SUMMARY OF THE INVENTION

Objects and advantages of the invention will be set forth in part in the following description, or may be obvious from the description, or may be learned through practice of the invention.

According to a first aspect of the invention, there is provided a method of transmitting stereophonic audio signals, the method comprising splitting each of the two channels into two frequency bands, combining the lower frequency band signals of the two channels, and transmitting the combined signals or signals representative thereof and the higher frequency band signals of the two channels or signals representative thereof.

According to a second aspect of the invention, there is provided a method of transmitting stereophonic audio signals, the method comprising: splitting each of the two channels into frequency bands, combining the lower frequency band signals of the two channels, shifting downwards in frequency the higher frequency band signals of the two channels, and transmitting the combined signal, or signals representative thereof, and the frequency shifted signals, or signals representative thereof.

According to a third aspect of the invention, there is provided apparatus for transmitting stereophonic audio signals, the apparatus comprising: a splitter for splitting each of the two channels into two frequency bands, a combiner for combining the lower frequency band signals of the two channels, and a transmitter for transmitting the combined signals, or signals representative thereof, and the higher frequency band signals of the two channels, or signals representative thereof.

According to a fourth aspect of the invention, there is provided apparatus for transmitting stereophonic audio signals, the apparatus comprising: a splitter for splitting each of the two channels into two frequency bands, a combiner for combining the lower frequency band signals of the two channels, a frequency shifter, for frequency shifting downwards the higher frequency band signals of the two channels, and a transmitter for transmitting the combined signal, or signals representative thereof, and the frequency shifted signals, or signals representative thereof.

According to a fifth aspect of the invention, there is provided apparatus for reproducing stereophonic audio signals, the apparatus comprising means for receiving signals transmitted over three audio channels, means for combining signals received over a first one of said channels with signals received over a second one of said channels, to provide a first channel output, and means for combining signals received over the first one of said channels with signals received over a third one of said channels, to provide a second channel output.

Additional objects and advantages of the invention will be set forth in part in the description that follows, and in part will be obvious from the description, or may be learned through practice of the invention. The objects and advantages of the invention may be realized and attained by means of the instrumentalities and combinations particularly pointed out in the appended claims.

The accompanying drawings, which are incorporated in and constitute a part of this specification, illustrate at least one presently preferred embodiment of the invention as well as some alternative embodiments. These drawings, together with the description, serve to explain the principles of the invention but by no means are intended to be exhaustive of all the possible manifestations of the invention.

BRIEF DESCRIPTION OF THE DRAWINGS

The above and other aspects, features, and advantages of the present subject matter will be more apparent from the following more particular description of exemplary embodiments of the disclosed technology as set forth in the appended figures, in which.

DETAILED DESCRIPTION OF THE PREFERRED EMBODIMENTS

Reference now will be made in detail to the presently preferred embodiments of the invention. Each example is provided by way of explanation of the related technology, which is not restricted to the specifics of the examples. In fact, it will be apparent to those skilled in the art that various modifications and variations can be made in the present subject matter without departing from the scope or spirit of the subject matter. For instance, features illustrated or described as part of one embodiment, can be used on another embodiment to yield a still further embodiment. Thus, it is intended that the present subject matter cover such modifications and variations as come within the scope of the appended claims and their equivalents.

Figure 1:
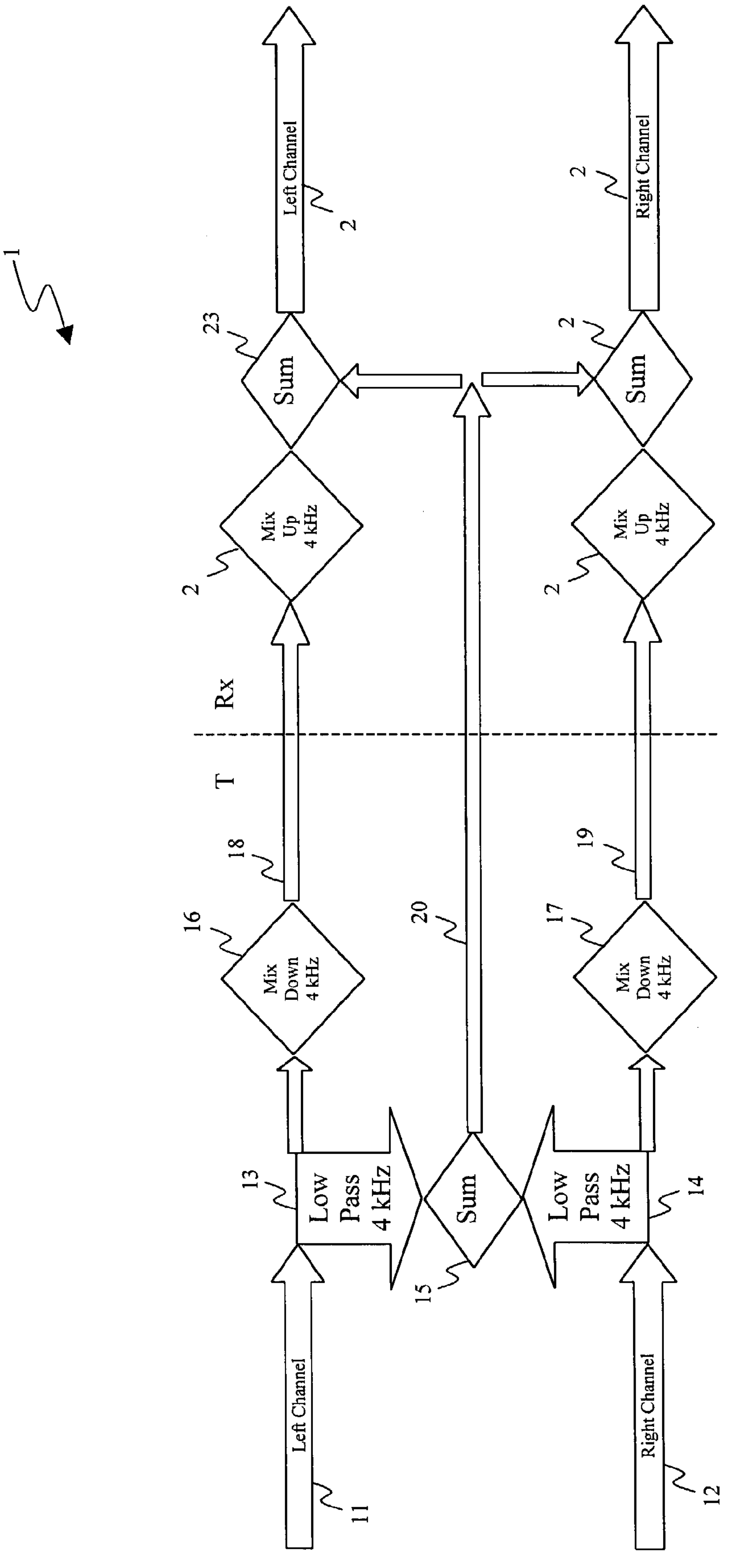
FIG. 1 is a block schematic diagram illustrating the general concept of the invention.

Referring to FIG. 1, apparatus 10 for transmitting stereophonic audio signals is shown schematically. The apparatus comprises left and right audio channel inputs 11, 12 of 8 kHz bandwidth inputs. The first splitter 13 passes the lowest 4 kHz of the signal received at the left channel input 11 to a summer 15, and passes the highest 4 kHz to a downconverter 16. The second signal splitter 14 similarly passes the lowest 4 kHz of the signals received at the right channel input to another input of the summer 15, and passes the highest 4 kHz to a second downconverter 17. The downconverters 16, 17 each downconverts the signals received at its input by 4 kHz, and supplies them to a respective one of first and second 64 kb per second wireless data channels 18, 19. The summer 15 sums the signals it receives, and supplies them to a third 64 kb per second wireless data channel 20. Each of the data channels 18-20 therefore carries a digitized audio signal occupying a bandwidth between 0 Hz and 4 kHz.

Stereophonic audio signals are reconstructed at a receiver end of the data channels 18-20. First and second upconverters 21, 22 are connected one to each of the data channels 18, 19. These upconverters each shift the frequency of signals received upwards by 4 kHz, which results in signals the same as those applied to the respective downconverters 16, 17. Signals supplied by the first upconverter are added to signals received over the third data channel 20 in a second summer 23, and the result supplied to a left channel output 24. Similarly, a second summer 25 sums the signals supplied by the second upconverter 22 with signals received over the third data channel 20, and supplies the result to a right channel output 26.

The result is the transmission of 16 kHz of audio signals over channels having a combined bandwidth of 12 kHz. This is achieved without any reduction in signal quality of the higher frequencies, but at the expense of inaccurate reproduction of lower frequency signals. However, this is not considered to be a problem in many circumstances since, with most recorded music, it is uncommon to find a significant difference between the low frequency components of the left and right channels. Also, the human ear is much less able to discern the direction of origin of low frequency sound than that of high frequency sound, so a human listener is unlikely to be able to detect a difference between the apparatus 10 being used and not being used. This applies whether sound is reproduced using speakers or using head phones.

Figure 2:
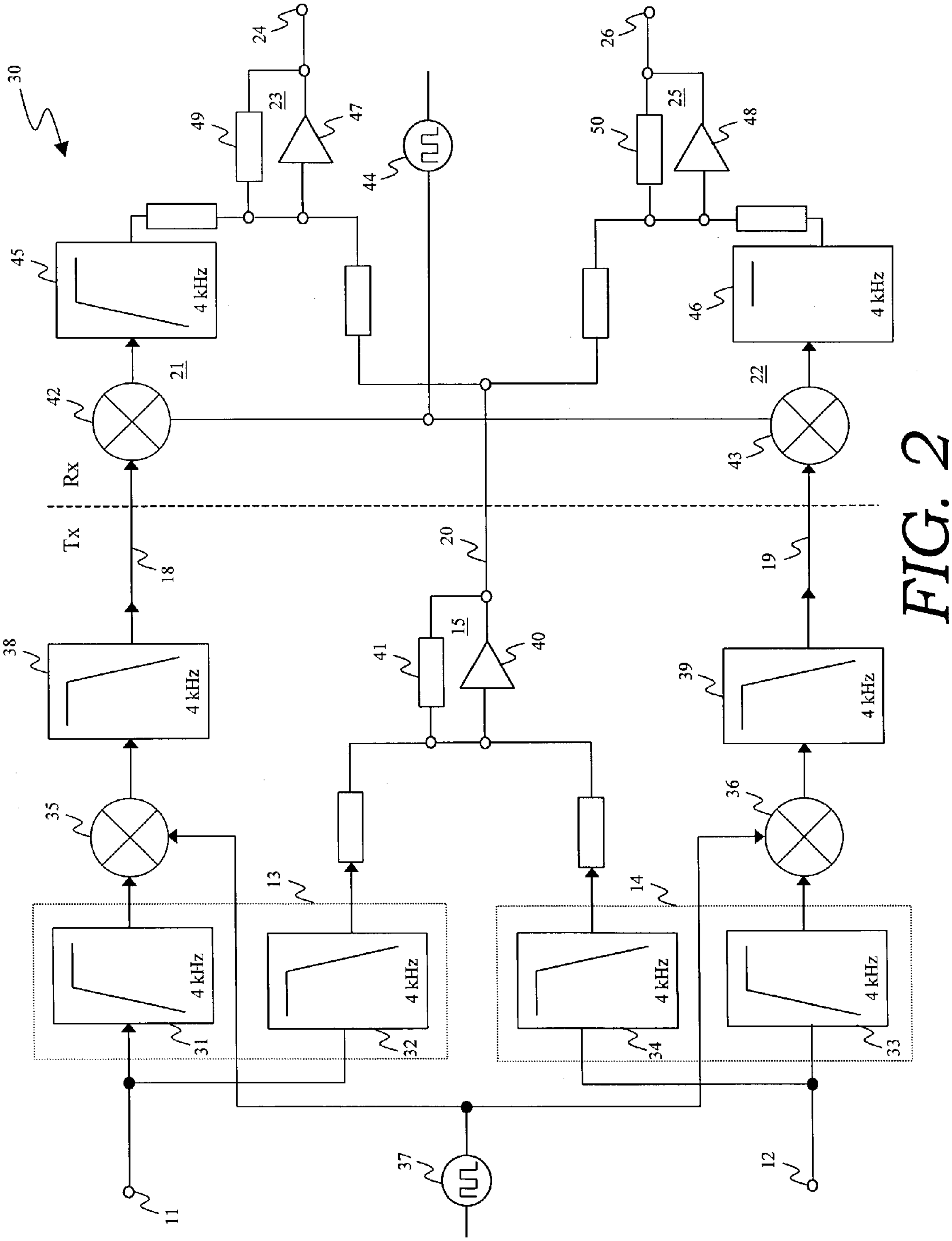
FIGS. 2 and 3 are circuit schematic diagrams of first and second exemplary implementations of the invention.

An analog implementation of the apparatus 10 is shown at 30 in FIG. 2, in which reference numerals are re-used for like elements. Referring to FIG. 2, the apparatus 30 includes, as the first signal splitter 13, a high-pass filter 31 and a low-pass filter 32. Each of the filters 31, 32 has a cut-off frequency of 4 kHz. The second signal splitter 14 similarly comprises a second high-pass filter 33 and a second low-pass filter 34, also having cut-off frequencies of a 4 kHz. The downconverters 16, 17 are formed from first and second mixers 35, 36, which are commonly connected to a 4 kHz square wave oscillator 37. The outputs of the mixers 35, 36 are filtered by respective low-pass filters 38, 39, each having a 4 kHz cut-off frequency, to remove the unwanted sum frequencies. The summer 15 is constituted by an amplifier 40 having a feedback resistor 41.

On the receiver side, the upconverters 21, 22 are formed by respective mixers 42, 43, which are commonly fed by a 4 kHz square wave oscillator 44. The mixers 42, 43 of the upconverters 21, 22 are succeeded by respective high-pass filters 45, 46, which each have a cut-off frequency of 4 kHz. The summers 23, 25 are constituted by respective amplifiers 47, 48 having a respective feedback resistor 49, 50. In one embodiment, the data cannels 18-20 are Bluetooth audio channels. To this end, the apparatus 10 includes analog-to-digital converters (ADCs), a modulator, a radio transmitter, a radio receiver, a demodulator and digital-to-analog converters (DACs), which are not shown. The signals transmitted over the data channels 18-20 are not, therefore, the signals provided by the filters 38, 39 and the summer 15. Rather, the transmitted signals are representative of the signals provided by the filters 38, 39 and the summer 15. The representative signals are processed at the receiver side to reconstruct the signals provided by the filters 38, 39 and the summer 15.

Figure 3:
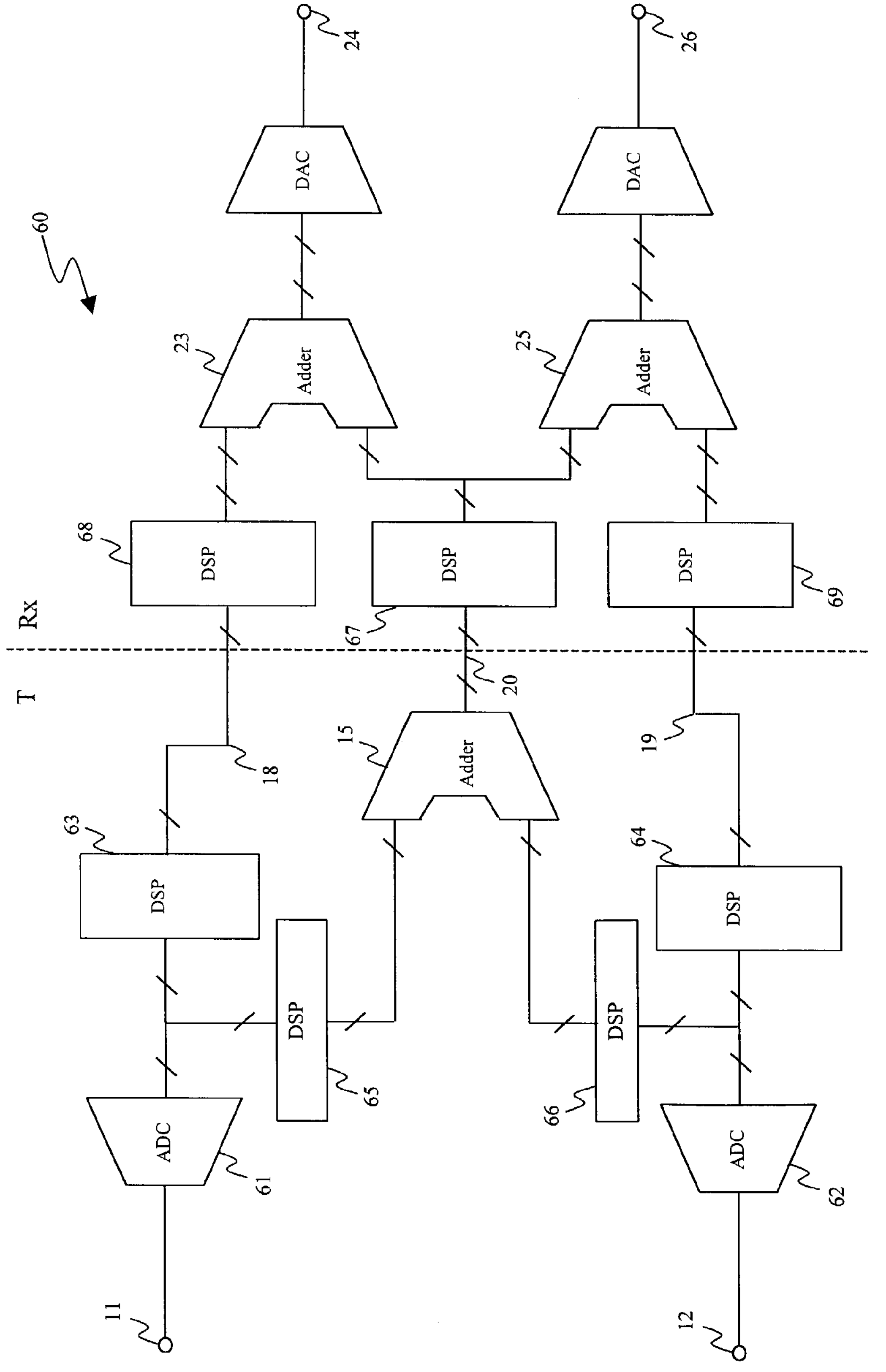

A digital implementation of the apparatus 10 is shown at 60 in FIG. 3. Reference numerals are reused from FIG. 1 for like elements. Referring to FIG. 3, the apparatus 60 comprises left and right ADCs 61, 62, each of which samples signals received at its respective input 11, 12 and provides 16 k samples thereof per second at its output. A first digital signal processor (DSP) 63 is arranged to receive the sampled left channel signals, to perform high-pass filtering to eliminate signals having a frequency less than 4 kHz, to downconvert the result by 4 kHz and to low-pass filter the downconverted signal to eliminate signals having a frequency above 4 kHz. Signals provided by the first DSP 63 have a sampling rate of 8 k bits per second. A second DSP 64 performs the same functions in respect of signals provided by the right channel ADC 62. The samples provided by the left and right ADCs 61, 62 are also high-pass filtered, to remove signals having frequencies over 4 kHz, by respective third and fourth DSPs 65, 66. Signals emanating from the third and fourth DSPs are added together by a digital summer 15, which provides output samples at 8 k bits per second. The signals provided by the first and second DSPs 63, 64 and by the adder 15 are prepared for transmission over respective Bluetooth 64 k bits per second voice channels 18-20 by apparatus which is not shown.

At the receiver end, apparatus which is not shown demodulates the Bluetooth transmitted data, and returns it to three separate 8 k bits per second digital channels. The signals received over the third data channel 20 are processed by a fifth DSP 67, which doubles their sampling rate. Signals received over the second channel 18 are processed by a sixth DSP 68, which is arranged to upconvert the signals by 4 kHz and then to high-pass filter the result to remove components having frequencies less than 4 kHz. The result is samples at 16 k bits per second, which is provided to second summer 23. A seventh DSP 69 performs the same functions on signals received over the second channel 19, and provides 16 k bits per second samples to the third summer 25. The second and third summers add the signals received from their respective DSP 68, 69 to signals provided by the fifth DSP 67, resulting in 16 k bit per second samples at their respective output. The summers 23, 25 are connected to their respective output 24, 26 by respective DACs 70, 71.

Various alternative embodiments exist. In one embodiment, analog signals are processed at the transmitter side, as in the FIG. 2 embodiment, and processed digitally at the receiver side, as in the FIG. 3 embodiment. In another embodiment (not shown), signals are processed digitally at the transmitter side, and analog signals are processed at the receiver side.

The use of Bluetooth SCO channels is not essential to the invention. Any suitable channels could be used, depending on the bandwidth requirements. Also, the split of the higher frequency components from the lower frequency components is alterable. Where three 6 kHz channels are available, for example, stereo signals having a bandwidth of 12 kHz may be transmitted by removing the lower 6 kHz of each channel, summing these signals and transmitting the sum over a third channel. In this case, the left and right channels each carry signals having a bandwidth of 6 kHz, and the third channel carries signals having a 6 kHz bandwidth.

While at least one presently preferred embodiment of the invention has been described using specific terms, such description is for illustrative purposes only, and it is to be understood that changes and variations may be made without departing from the spirit or scope of the following claims.

What is claimed is:

1. A method of transmitting stereophonic audio signals, said method comprising the following steps:
splitting the signals on each of two audio channels into respective higher and lower frequency bands;
combining said lower frequency band signals of said two audio channels;
transmitting the combined lower frequency band signals or signals representative thereof over a first channel, and the respective higher frequency band signals of said two audio channels or signals representative thereof over a second and third channel, and
combining each of the transmitted higher frequency band signals or the signals representative thereof, with the combined lower frequency band signals, or the signals representative thereof.

2. A method as in claim 1, in which said transmitting step comprises transmitting the signals over three digital data channels.

3. A method as in claim 1, in which said transmitting step comprises transmitting the signals over a radio link.

4. A method of transmitting stereophonic audio signals, said method comprising the following steps:
splitting the signals on each of two audio channels into respective higher and lower frequency bands;
combining said lower frequency band signals of said two channels;
shifting downwards in frequency the respective higher frequency band signals of said two audio channels; and
transmitting the combined lower frequency band signals, or signals representative thereof over a first channel, and the respective frequency shifted signals, or signals represented thereof over a second and third channel.

5. A method as in claim 4, further comprising the steps of:
shifting upwards in frequency each of the transmitted respective frequency shifted signals, or the signals representative thereof; and
combining each of the resulting signals from said step of shifting upwards with the combined lower frequency band signals or the signals representative thereof.

6. A method as in claim 4, in which said transmitting step comprises transmitting the signals over three digital data channels.

7. A method as in claim 4, in which said transmitting step comprises transmitting the signals over a radio link.

8. A device for transmitting stereophonic audio signals, comprising:
a splitter for splitting each of two audio channels into respective first and second frequency bands;
a combiner for combining the first frequency band signals of said two audio channels;
a transmitter for transmitting the combined first frequency band signals, or signals representative thereof over a first channel, and the second frequency band signals of the two respective audio channels, or signals representative thereof over a second channel and a third channel;
a second combiner for combining the combined first frequency band signals, or the signals representative thereof, with the second frequency band signals representative of a selected one of said two audio channels, or the signals representative thereof; and
a third combiner for combining the transmitted combined first frequency band signals, or the signals representative thereof, with the second frequency band signals of the other one of said two audio channels, or the signals representative thereof.

9. A device as in claim 8, in which said transmitter is configured to transmit signals over three audio channels.

10. A device as in claim 8, wherein said transmitter comprises a radio transmitter.

11. An apparatus for transmitting stereophonic audio signals, comprising:
a splitter for splitting each of two audio channels into respective first and second frequency bands;
a combiner for combining the first frequency band signals of said two audio channels;
for each audio channel, a frequency shifter, for downwards shifting the frequency of the respective second frequency band signals of said two audio channels; and
a transmitter for transmitting the combined first frequency band signals, or signals representative thereof over a first channel, and the respective shifted second frequency band signals of said two audio channels, or signals representative thereof over a second and third channel.

12. An apparatus as in claim 11, further comprising:
an additional frequency shifter for upwards shifting the frequency of the respective transmitted frequency downshifted signals, or the signals representative thereof; and
a second combiner for combining each of the resulting signals up-shifted via said additional frequency shifter with the transmitted combined first frequency band signals, or the signals representative thereof.

13. An apparatus as in claim 11, in which said transmitter is configured to transmit signals over three audio channels.

14. An apparatus as in claim 11, wherein said transmitter comprises a radio transmitter.

15. A device for reproducing stereophonic audio signals, comprising:
a radio receiver for receiving signals transmitted over three audio channels;
a first summer for combining signals received over a first one of said audio channels with signals received over a second one of said audio channels, to provide a first channel output;
a second summer for combining signals received over the first one of said audio channels with signals received over a third one of said audio channels, to provide a second channel output; and
at least one frequency shifter for translating signals received over the second and third audio channels before said signals received over the second and third audio channels are respectively provided to said first and second summers.

16. A device as in claim 15, wherein said at least one frequency shifter comprises a mixer configured to receive selected signals received over said second and third audio channels and an oscillator signal.

17. A device as in claim 15, wherein said at least one frequency shifter comprises a digital signal processor.

18. A method of transmitting stereophonic audio signals, said method comprising the following steps:
splitting the signals on each of left and right audio channels into respective higher and lower frequency bands; combining said lower frequency band signals of said two audio channels; and transmitting the combined lower frequency band signals or signals representative thereof over a first channel and the respective higher frequency band signals of said two audio channels or signals representative thereof over a second and third channel.

19. A method as in claim 18, wherein:

the combined lower frequency band signals, or the signals representative thereof, are transmitted over the first channel;

the higher frequency band signals of the left audio channel, or the signals representative thereof, are transmitted over second channel; and the higher frequency band signals of the right audio channel, or the signals representative thereof, are transmitted over the third channel.

20. A device for transmitting stereophonic audio signals, comprising:

a splitter for splitting each of left or right audio channels into respective first and second frequency bands;

a combiner for combining the first frequency band signals of said two audio channels; and a transmitter for transmitting the combined first frequency band signals, or signals representative thereof over a first channel, and the second frequency band signals of the two respective audio channels, or signals representative thereof over a second and third channel.

21. A device as in claim 20, wherein the transmitter is configured in that:

the combined lower frequency band signals, or the signals representative thereof, are transmitted over the first channel;

the higher frequency band signals of the left audio channel, or the signals representative thereof, are transmitted over second channel; and the higher frequency band signals of the right audio channel, or the signals representative thereof, are transmitted over the third channel.

* * * * *